United States Patent [19]

Asakawa et al.

[11] Patent Number: 5,008,554

[45] Date of Patent: Apr. 16, 1991

[54] MULTI-PLATE OPTICAL SIGNAL PROCESSING APPARATUS WITH INTER-PLATE OPTICAL COMMUNICATION

[75] Inventors: Toshifumi Asakawa, Yamato; Haruo Nakayama, Kawanishi, both of Japan

[73] Assignee: Ricoh Company, Ltd., Tokyo, Japan

[21] Appl. No.: 373,932

[22] Filed: Jun. 29, 1989

[30] Foreign Application Priority Data

Jul. 4, 1988 [JP] Japan ................................ 63-166168

[51] Int. Cl.$^5$ .............................................. G02B 27/00
[52] U.S. Cl. .................................. 250/551; 250/227.11
[58] Field of Search .............. 250/213 A, 551, 227.11; 350/96.11, 96.20; 357/19; 365/114; 455/610, 612

[56] References Cited

U.S. PATENT DOCUMENTS

| 4,672,577 | 6/1987 | Hirose et al. | 365/114 |
| 4,809,358 | 2/1989 | Fernstrom | 350/96.11 |
| 4,812,002 | 3/1989 | Kato et al. | 350/96.20 |

Primary Examiner—David C. Nelms
Attorney, Agent, or Firm—Cooper & Dunham

[57] ABSTRACT

An optical signal processing apparatus includes a plurality of plates disposed in parallel at spatial intervals and light LSIs mounted on each of the plates. The transfer of signals in the direction parallel to the surfaces of the plates is performed by lead wires electrically interconnecting the light LSIs. The transfer of signals in the direction normal to the surfaces is performed by the light emitted and received by the light LSIs.

10 Claims, 6 Drawing Sheets

MULTI-PLATE OPTICAL SIGNAL PROCESSING APPARATUS WITH INTER-PLATE OPTICAL COMMUNICATION

BACKGROUND OF THE INVENTION

The present invention relates to an optical signal processing apparatus comprising a group of light LSIs.

In a conventional signal processing apparatus comprising a group of LSIs, circuit components (LSIs) are arranged in a plane and these are interconnected by lead wires. An LSI for processing a very large amount of data, such as a neuron LSI, has many input and output lines the number of which amounts to 10,000 to 100,000. Because of this, if a conventional package, employing PGA of 50 mil×50 mil pitch, is used for such LSI, the package will have a large size ranging from 5"×5" to 15"×15".

Further, assuming that wire bonding time for one wire is 0.2 seconds, the total wire bonding time will be from 2,000 to 20,000 seconds (from 33 minutes to 5 hours and 30 minutes). If the time required for correcting bonding errors is additionally added to the total wire bonding time, a considerable time will be required for the bonding work. The same problem exists in the probe for testing and evaluating the apparatus.

As mentioned above, in the conventional signal processing apparatus, it is impossible to actually arrange the LSIs of the type which input and output a great amount of data in parallel.

SUMMARY OF THE INVENTION

Accordingly, an object of the present invention is to provide an optical signal processing apparatus in which a number of LSIs for processing a great amount of data being transferred in parallel can be interconnected with a minimum number of input and output lead wires.

The object of the invention can be achieved by an optical signal processing apparatus comprising a plurality of plates disposed in parallel at spatial intervals, and light LSIs mounted on each of said plates, transference of signals among said light LSIs in the direction parallel to surfaces of said plates being performed by lead wires electrically interconnecting said light LSIs, and transference of signals among said light LSIs in the direction normal to said surfaces being performed by light emitted and received by said light LSIs.

In a living organism, a tremendous number of nerve fibers are extended toward the medulla bulb. Through the nerve fibers, the brain gives various directions to the respective portions of the body, and the information derived from the sensors at the respective portions is transferred to the brain. Similarly, in the arrangement of circuit elements in an electronic circuitry, it is preferable to arrange the circuit elements in three dimensions in such a manner that these elements are arranged not only in a plane, but also in the direction normal to the plane, viz., vertically.

At the present stage of technology, the only way of transmitting a large amount of data within a short period of time employs an optical means. For example, a typical camera is capable of transmitting data of 80 M byte onto a film within 1/30 to 1/100 seconds. The amount of data transferred by the camera is almost equal to that transmitted by approximately $10^7$ lead wires.

The apparatus of the present invention employs a three-dimensional arrangement and an optical data transferring means in order to solve the problems of the wire bonding time and of the space required for accommodating the input and output lead wires.

Other objects, features, and advantages of the present invention will be apparent from the following description of the preferred embodiments of the invention as illustrated in the accompanying drawings.

DETAILED DESCRIPTION OF THE PREFERRED EMBODIMENTS

The preferred embodiments of the present invention will be described with reference to the accompanying drawings.

Figure 1:
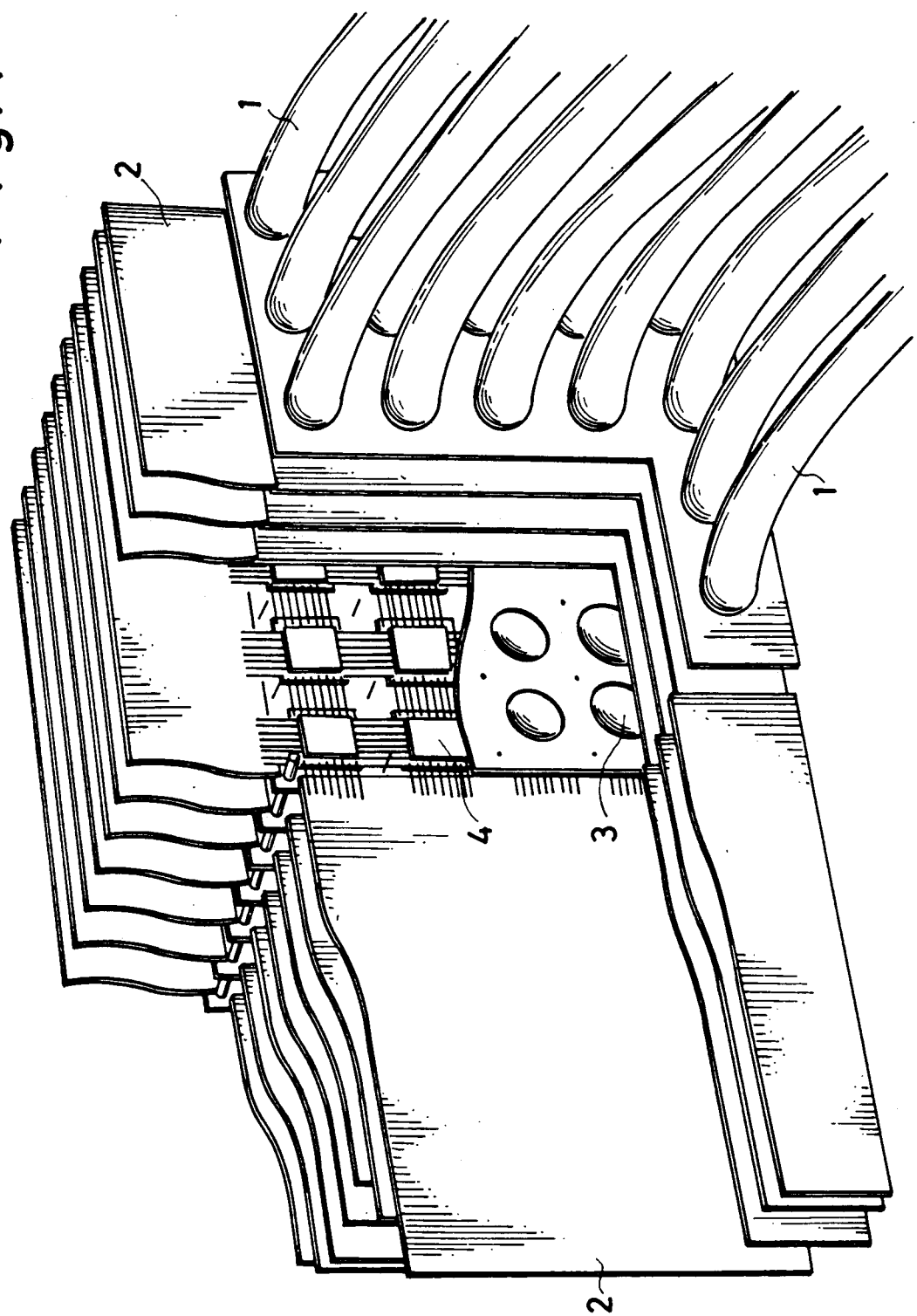
FIG. 1 is a perspective view showing an embodiment of an optical signal processing apparatus according to the present invention.

FIG. 1 shows a perspective view of one embodiment of the optical signal processing apparatus according to the invention. In FIG. 1, reference numeral 1 denotes bundles of optical fiber; 2, flat cables; 3, lenses for converging or refracting light beams passing through optical fibers 1; and 4, light LSIs.

In the light LSI, a light emitting element in place of a driver is used as an output element, and a light receiving element is used as an input element. The light receiving element may be a p-n junction made of silicon or a photo transistor, for example. The light emitting element may be a light emitting diode (LED), for example. The LED can be realized by forming a single crystal thin film of GaAs or GaAlAs by an SOI (silicon on insulating material) technique. Transference of signals among these elements is performed through a transparent glass window. The size of those elements is approximately $100\mu \times 100\mu$. With this size, a maximum of 10,000 input and output lines can be formed on a chip having the size of 1 cm×1 cm.

Thus, in the direction normal to a flat plate on which the light LSIs are arrayed, viz., the vertical direction, signals are optically transferred. In the direction parallel to the surface of the flat plate, viz., the lateral or horizontal direction, signals are transferred by lead wires as in the conventional case. The lead wires form the flat cable 2. In this way, space in the optical signal processing apparatus is effectively utilized.

The LSI 4 and the optical fiber 1 are coupled to each other by way of the lens 3 and a half mirror (not shown). The half mirror is located at a proper place as required.

Figure 2:
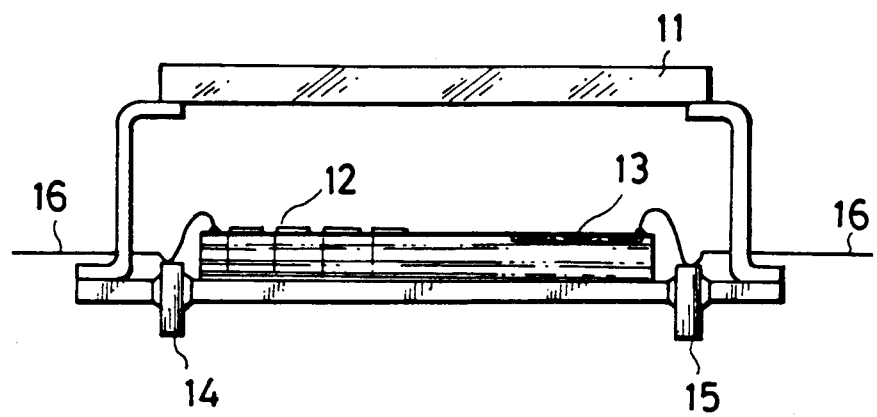
FIG. 2 shows a sectional view of the light LSI of FIG. 1.
Figure 3:
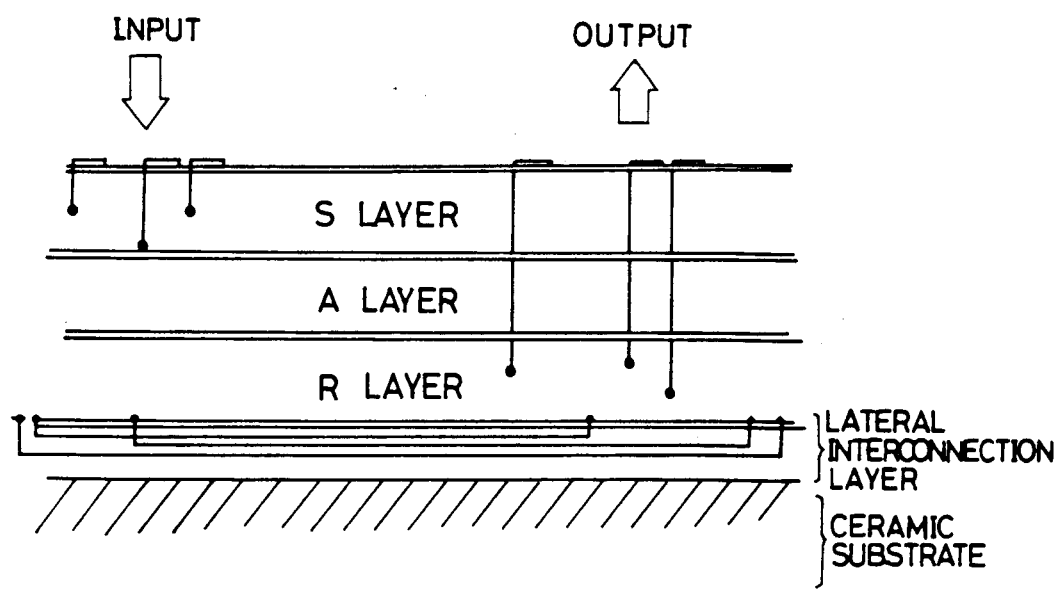
FIG. 3 is an explanatory view for explaining a multi-layer structure of the light LSI of FIG. 2.

FIG. 2 shows a sectional view of one of light LSIs used in the apparatus of FIG. 1. FIG. 3 schematically illustrates a layer-structure inside the LSI of FIG. 2.

The light LSI shown in FIG. 2 comprises a glass plate 11 through which an optical signal passes, a photo diode 13 for converting an input optical signal into an electric signal, an LED 12 for converting an electric signal into an optical signal, lead wires 16 for transferring electric signal in the lateral direction, a power line 14, and a ground line 15.

As shown in FIG. 3, the LED 12 and the photo diode 13 are underlaid with IC layers. Thus, in this embodiment, the light LSIs of the optical signal processing apparatus are arrayed in three-dimensions. Further, the light LSI per se has a three-dimensional inner structure. In the illustration of FIG. 3, an S (sensor) layer, an A (amplifying) layer and an R (responding) layer are layered in this order as viewed from top to bottom, and under these three layers a lateral wire layer and a ceramic substrate are layered. An input optical signal is converted into an electric signal by the photo diode 13, and is received by the S layer, where it is subjected to an A/D (analog to digital) conversion. This signal is then transferred to the A layer. In the A layer, the digitized signal is subjected to necessary signal processings, such as amplification operation, and coding. The signal thus processed is applied to the R layer. In this layer, the signal is converted into an analog signal as a response signal. The response signal is transferred to the surface of the structure of the light LSI. Lastly, it is converted into an optical signal by the LED 12 on the structure surface. The substrate of the light LSI may be made of glass or crystal. In this case, an optical signal can enter the LSI through both the surfaces of the structure, that is, through the upper surface and the lower surface.

The decrease of the number of necessary lead wires is realized by arranging the light LSIs in three dimensions as described above. It is also realized by interconnecting the circuit components by means of optical buses. The optical bus will be described herein after.

Figure 4:
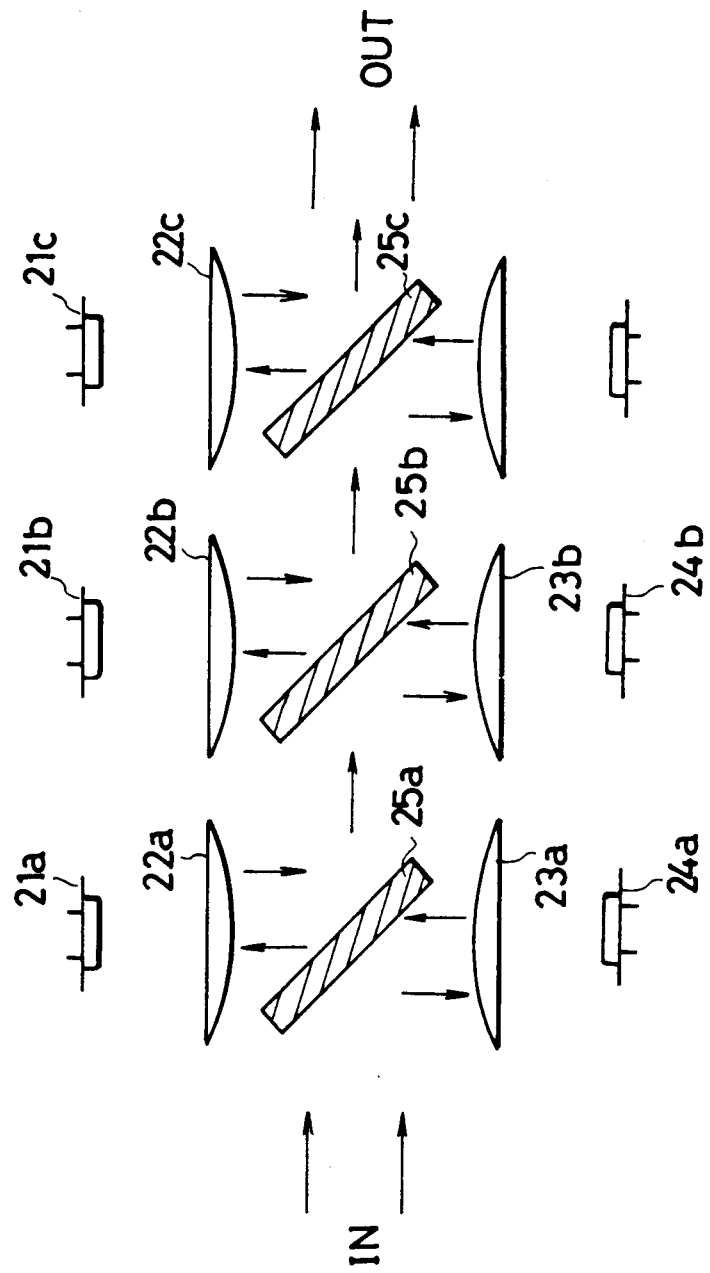
FIG. 4 shows an explanatory view for explaining the structure of an optical bus.

In FIG. 4, reference numerals 21a, 21b, 24a, and 24b denote elements each functioning as both a light emitting diode and a photo diode. The light emitting diode converts an electric signal already processed into an optical signal, and transmits the optical signal to a transmission line (optical bus). The photo diode receives an optical signal from the transmission line and converts it into an electric signal. Reference numerals 22a, 22b, 23a and 23b denote lenses for converging or refracting light. 25a and 25b denote half mirrors each of which reflects a part of an incident light and allows the other part of the incident light to pass therethrough.

The optical bus shown in FIG. 4 interconnects first to 6th circuits (not shown) of the optical signal processing apparatus. An input optical signal is partially reflected by the half mirror 25a, passes through the lens 22a, and reaches the photo diode 21a. The signal derived from the photo diode 21a is applied to the first circuit. Another part of the input optical signal passes through the half mirror 25a, and enters the next half mirror 25b. Part of the optical signal reaching the half mirror 25b is reflected by the half mirror 25b, and is inputted to the second circuit by way of the lens 22b and the photo diode 21b. Another part of the optical signal passes through the half mirror 25b and is applied to the third circuit by way of a similar route. The signals appropriately processed by the first to third circuits are outputted to the optical bus by way of the light emitting diodes 21a, 21b and 21c, respectively. Then, these signals are outputted through the half mirrors 25a, 25b and 25c to the exterior. Also, the incident light is reflected by the half mirror 25a, enters the photo diode 24a by way of the lens 23a, and then enters the fourth circuit. Part of the incident light passes through the half mirror 25a, reaches the next half mirror 25b, and reflected there. Then, it enters the fifth circuit through the lens 23b. The remaining incident light passes through the half mirror 25b, and enters the sixth circuit at the next stage by way of a similar route.

Figure 5:
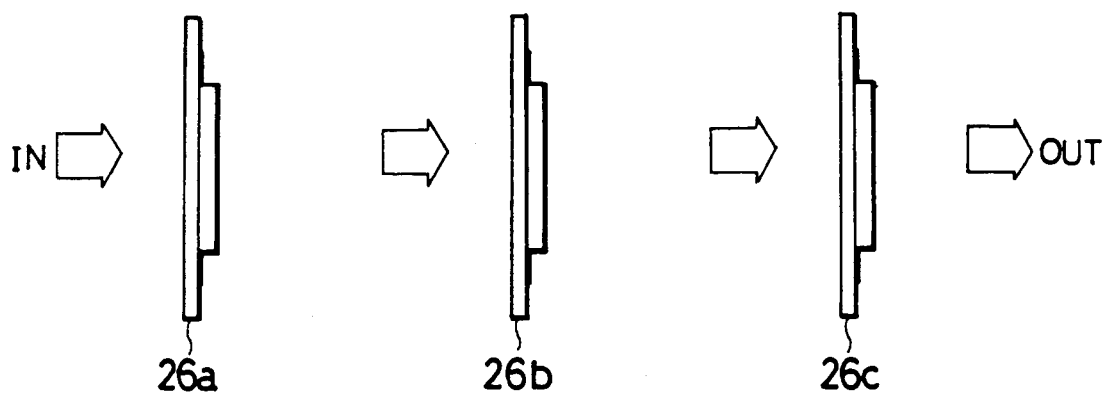
FIG. 5 is an explanatory view showing an optical bus including optical repeaters.

FIG. 5 shows an optical bus including optical repeaters 26a, 26b and 26c.

The light traveling through the optical bus is attenuated and its waveform is distorted by absorption and dispersion in the space within the bus. These repeaters 26a, 26b and 26c compensate for the attenuation and waveform distortion of the light to recover the original level and form. Each repeater comprises a light receiving circuit, a regenerating circuit, and a light transmitting circuit. The regenerating circuit has the same functions as those of a conventional regenerating circuit, such as equalizing, amplifying, retiming, and discrimination. The light receiving circuit and the light transmitting circuit may be a photo diode and a light emitting diode, respectively. FIG. 5 shows the repeaters 26a, 26b and 26c inserted between the input and the output of one optical signal processing apparatus.

Figure 6:
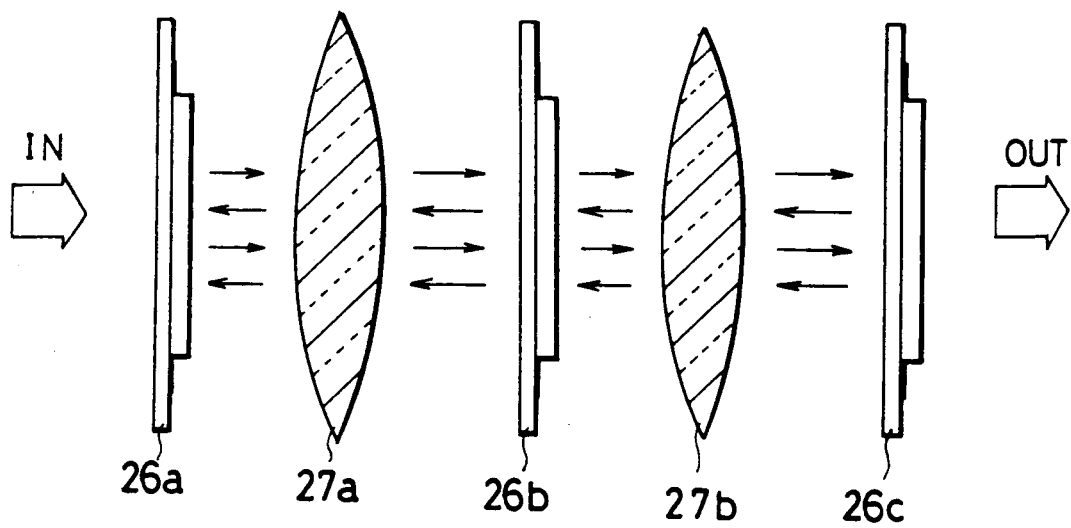
FIG. 6 is an explanatory view showing a bidirectional optical bus.

Turning now to FIG. 6, there is shown a bidirectional optical bus which is provided with repeaters 26a, 26b, and 26c, and lenses 27a and 27b. Each of these repeaters 26a, 26b and 26c has the functions to receive, amplify, and transmit light signals. The light passing through the lenses 27a and 27b is not attenuated. Therefore, the optical signal processing apparatus using the optical bus can produce an output signal which has substantially the same level as the input signal.

Figure 7:
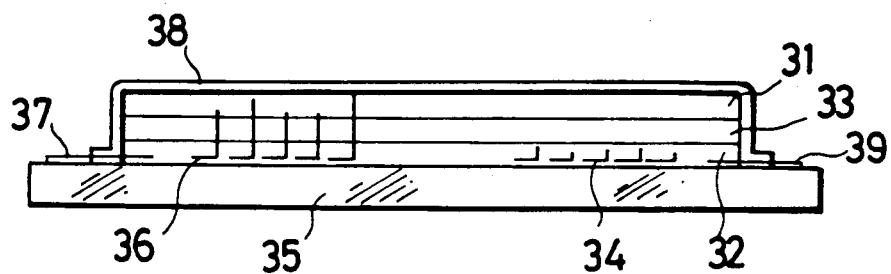
FIGS. 7 to 10 show sectional views of some specific examples of light LSIs coupled with an optical bus.
Figure 7:

FIG. 7 shows a sectional view of a first specific example of a light LSI which may be coupled with the optical bus mentioned above.

In this light LSI, a substrate is made of transparent material such as glass or crystal. The light LSI receives light at the bottom and transmits it at the same bottom.

In FIG. 7, reference numeral 31 denotes a responding layer; 32 a sensing/driver layer, 33 an association layer; 34 an LED (light emitting diode); 35 a crystal or glass; 36 a photo diode; 37 a ground line; 38 a passivation; and 39 a power source $V_{DD}$. An incoming light passes through the glass 35 and reaches the photo diode 36, where it is converted into an electric signal. The electric signal is then received by the sensing layer 32. In the association layer 33, a signal pertaining to the received signal is retrieved from signals prestored in a memory. In the responding layer 32, a response signal is formed. The driver layer 32 emits a light corresponding to the response signal.

Figure 8:
Figure 8:
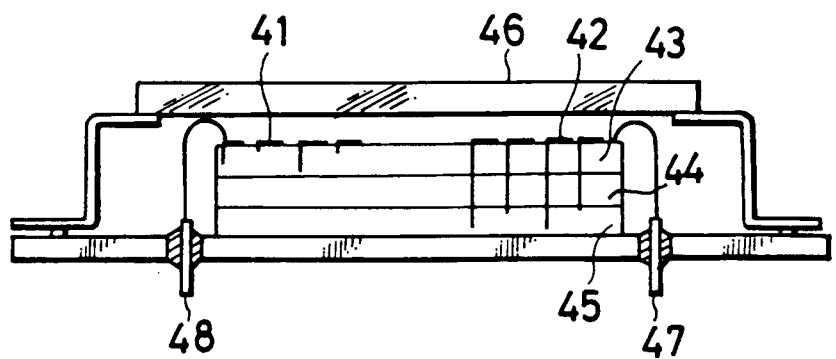

FIG. 8 shows a sectional view of a second specific example of a light LSI which may be coupled with the optical bus mentioned above.

The light LSI shown in FIG. 8 is arranged such that a glass window is provided at the top of the LSI structure, and it receives an incoming light at the top and returns a response or outgoing light also at the top.

In the figure, reference numeral 41 denotes a photo diode; 42 an LED; 43 a sensing layer; 44 an association layer; 45 a responding layer; 46 a glass window; 47 a power source; and 48 a ground line.

The inner circuit arrangement and their functions of the light LSI are the same as those of FIG. 7. Hence, no further explanation of them will be given.

Figure 9:
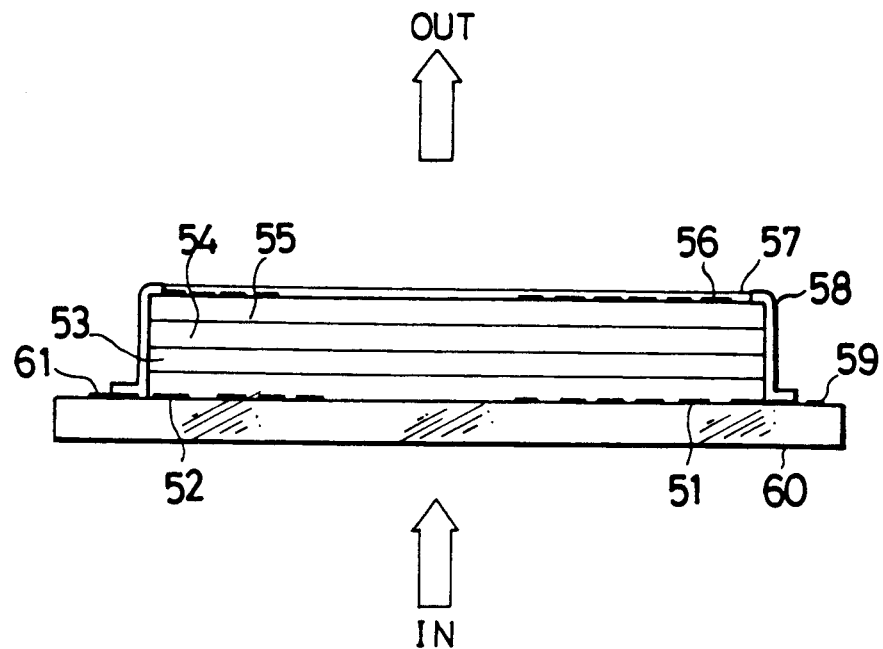

FIG. 9 shows a sectional view of a third specific example of a light LSI which may be coupled with the optical bus mentioned above.

The light LSI shown in FIG. 8 is arranged such that its substrate is made of glass or crystal, a window is provided also at the top of the LSI structure, and it receives an incoming light at the bottom, and returns a response or outgoing light at the top.

In the figure, reference numeral 51 indicates a photo diode; 52 an amplifier (A/D converter); 53 a multiplexer; 54 a MULT/ACC (multiplier/-accumulator); 55 a DA converter/driver; 56 an LED; 57 a window; 58 a passivation; 59 a power source; 60 glass or crystal; and 61 a ground line.

Incoming light is received at the bottom of the LSI structure and is converted into an electric signal. The converted electric signal is amplified and digitized by the amplifier 52. Then, it is distributed by the multiplexer 53, and is subjected to a proper signal processing by the MULT/ACC 54. The signal derived from the circuit 54 is converted into an analog signal by the DA converter/driver 55. Light corresponding to the analog signal from the circuit 55 is emitted by the LED 56 through the window 57.

Figure 10:
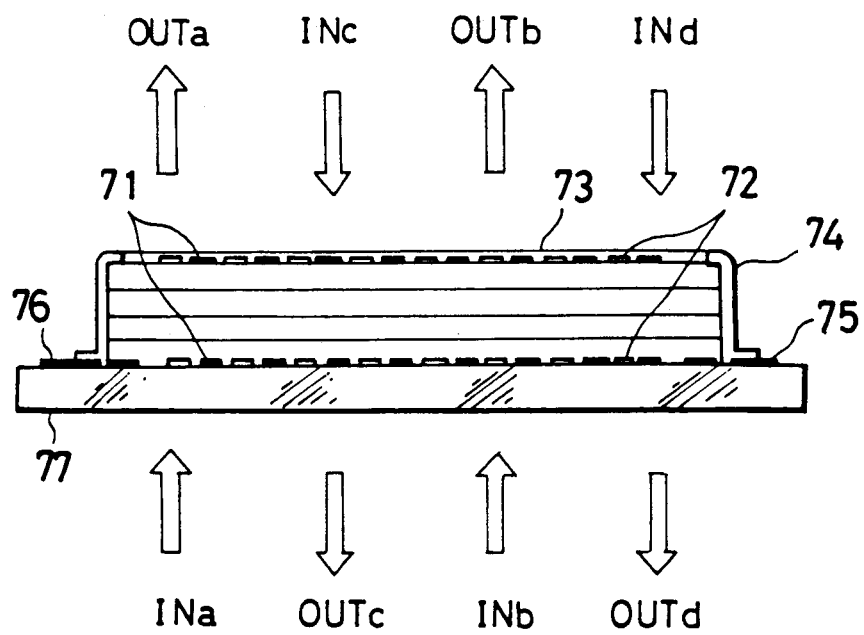

FIG. 10 shows a sectional view of a fourth specific example of a light LSI which may be coupled with the optical bus mentioned above.

The light LSI shown in FIG. 10 is so arranged as to receive a plurality of optical signals, appropriately process them, and output the same number of optical signals as that of the input optical signals. The light LSI receives half of those optical signals at the top of the LSI structure, processes the received signals, and outputs them at the bottom. And it receives remaining optical signals at the bottom, processes the received signals, and outputs them at the top. Thus, the light LSI is a bidirectional optical device.

In the figure, reference numeral 71 denotes a photo diode; 72 an LED; 73 a window; 74 a passivation; 75 a power source; 76 a ground line; and 77 a substrate. As shown, the photo diodes 71 and the LEDs 72 are alternately arrayed on both the top surface and the bottom surface of the LSI structure. Accordingly, the light LSI in this instance can handle the lights from the upper and the lower parts. The number of the input and the output lines is equal to that of the photo diodes 71 and the LEDs 72.

It should be understood that the exemplary light LSIs discussed above can be used as neuron LSIs having a learning function and coupled with the optical bus.

Many widely different embodiments of the present invention may be constructed without departing from the spirit and scope of the present invention. It should be understood that the present invention is not limited to the specific embodiments described in the specification, except as defined in the appended claims.

What is claimed is:

1. An optical signal processing apparatus comprising: a plurality of plates disposed in parallel, spaced from each other;
light LSIs mounted on each of said plates;
lead wires electrically interconnecting said light LSIs to transfer signals among said light LSIs in directions along said plates; and
optical means extending in directions transverse to said plates and utilizing light emitted and received by said light LSIs to transfer signals among light LSIs mounted on different ones of said plates, in directions transverse to said plates.

2. An apparatus according to claim 1, wherein said optical means includes at least one optical cable coupled with at least one of said plates for transmitting a light signal to and from outside said apparatus.

3. An apparatus according to claim 1, wherein each of said light LSIs includes a light receiving element for receiving a light signal, a first layer for receiving said light signal from the light receiving element and for converting said light signal into an electric signal, a second layer for processing said electric signal, a third layer for generating a response signal from said electric signal processed by said second layer, and a light emitting element for receiving said response signal from said third layer and for emitting a light signal corresponding to said response signal.

4. An apparatus according to claim 3, wherein said light emitting element is an LED and said light receiving element is a photo transistor.

5. An apparatus according to claim 1, wherein each of said light LSIs is formed on a substrate made of a material selected from the group consisting of ceramic, glass and crystal.

6. An optical signal processing apparatus comprising:
a number of mounting plates arranged parallel to and spaced from each other;
each of said mounting plates having a number of light LSIs mounted thereon and spaced from each other along the mounting plate;
each mounting plate further having respective electrical interconnects coupled with the light LSIs mounted on the plate to transfer electrical signals along the mounting plate between the light LSIs mounted on the plate; and
optical cables interconnecting LSIs mounted on different ones of said mounting plates to transfer optical signals between LSIs mounted on different plates.

7. An apparatus as in claim 6, in which said LSIs comprise layered structures, wherein the layers of the LSIs mounted on a given mounting plate are parallel to the plane of said given plate and wherein the LSIs mounted on said given plate emit and receive light signals in a direction transverse to the plane of said given mounting plate.

8. An optical signal processing apparatus comprising:
a number of mounting plates arranged parallel to and spaced from each other;
each of said mounting plates having a number of light LSIs mounted thereon and spaced from each other along the plane of the mounting plate;
electrical interconnects coupled with at least selected ones of the light LSIs mounted on the plates to transfer electrical signals between LSIs in a first selected direction; and
optical interconnects coupled with at least selected ones of the LSIs to transfer optical signals between LSIs in a direction transverse to the direction in which said electrical interconnects transfer electrical signals between LSIs.

9. Apparatus as in claim 8, in which said electrical interconnects transfer electrical signals in directions parallel to the planes of the mounting plates and said optical interconnects transfer optical signals between LSIs mounted on different plates.

10. Apparatus as in claim 9, in which the LSIs mounted on a given plate emit and receive light signals in a direction transverse to the plane of said given mounting plate.

* * * * *